(12) United States Patent
Nishizawa

(10) Patent No.: US 7,112,968 B1
(45) Date of Patent: Sep. 26, 2006

(54) METHOD AND APPARATUS FOR DETECTING A PARTIAL DISCHARGE IN A HIGH-VOLTAGE TRANSMISSION AND DISTRIBUTION SYSTEM

(75) Inventor: Atsushi Nishizawa, Osaka (JP)

(73) Assignee: Haneron Co., Ltd., Osaka (JP)

( * ) Notice: Subject to any disclaimer, the term of this patent is extended or adjusted under 35 U.S.C. 154(b) by 0 days.

(21) Appl. No.: 11/290,919

(22) Filed: Nov. 30, 2005

(51) Int. Cl.
*G01R 31/12* (2006.01)

(52) U.S. Cl. ........................ 324/536; 324/551

(58) Field of Classification Search ................ 324/536, 324/551
See application file for complete search history.

(56) References Cited

U.S. PATENT DOCUMENTS

| 6,313,640 | B1 * | 11/2001 | Nasrallah et al. ............ 324/536 |
| 6,774,639 | B1 * | 8/2004 | Unsworth ..................... 324/547 |
| 2005/0184737 | A1 * | 8/2005 | Moriyama et al. .......... 324/536 |

FOREIGN PATENT DOCUMENTS

| JP | 06-308192 | 11/1994 |
| JP | 06-331686 | 12/1994 |

\* cited by examiner

*Primary Examiner*—Vincent Q. Nguyen
(74) *Attorney, Agent, or Firm*—Keating & Bennett, LLP (57) ABSTRACT

A method and an apparatus for detecting a partial discharge in a high-voltage transmission and distribution system include detectors which are respectively attached to a power cable and an antenna, such that a first signal and a second signal at a predetermined frequency are extracted using resonators. The first signal is supplied to a differential amplifier via a delay circuit. The second signal is supplied to the differential amplifier via a regulator that includes a variable delay circuit and a variable amplifier. The output from the differential amplifier is demodulated in a demodulator. The signal from the demodulator is supplied to an MPU via an A/D converter to determine the amount of adjustment in phase and amplitude which is to be supplied to the regulator. Then, control is provided such that the output from the differential amplifier is minimized in the absence of partial discharges.

5 Claims, 10 Drawing Sheets

Pulsed noise

METHOD AND APPARATUS FOR DETECTING A PARTIAL DISCHARGE IN A HIGH-VOLTAGE TRANSMISSION AND DISTRIBUTION SYSTEM

BACKGROUND OF THE INVENTION

1. Field of the Invention

The present invention relates to methods for detecting a partial discharge in a high-voltage transmission and distribution system, and a partial discharge detection apparatus used therefor. More particularly, the present invention relates to a method for detecting a partial discharge in an insulator of a high-voltage power cable, for example, and to a partial discharge detection system used therefor.

2. Description of the Related Art

For example, if there is foreign matter or a void in a portion of the insulator of a high-voltage power cable, a partial discharge occurs at that portion. A discharge phenomenon occurs in which an electrical tree grows in the insulator until an electrical breakdown, such as a short circuit, occurs. The inner portion of an electrical tree is hollow and the amount of the partial discharge (measured in pC) increases as the electrical tree grows. Thus, it is possible to predict an electrical breakdown by detecting a partial discharge and monitoring the amount of the partial discharge.

Accordingly, monitoring a partial discharge is performed by applying a voltage to a high-voltage transmission and distribution system, such as a power cable. However, since a signal associated with a partial discharge is very weak, the partial discharge often cannot be detected due to noise contamination. Such noise may be caused by electromagnetic waves, engine sparks from vehicles, sparks from motors, or aerial discharges from bare electrical wires or wire terminals. In order to prevent the influence of such noise, a partial discharge is detected in a shield room, as shown in FIG. 5.

Figure 5:
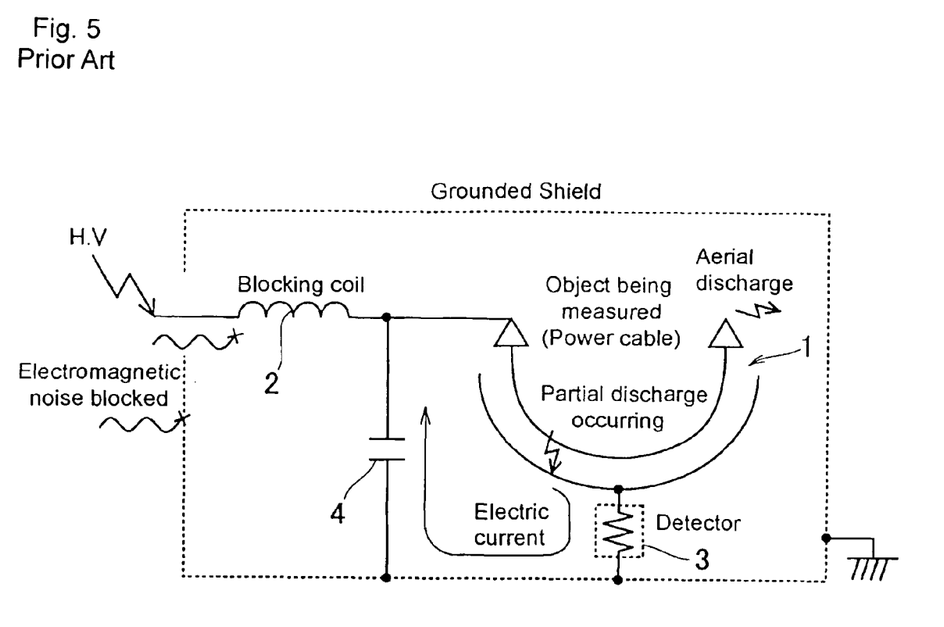
FIG. 5 is a schematic view showing a conventional method for sensing a partial discharge in an insulator of a power cable inside a shield room.
Figure 6:
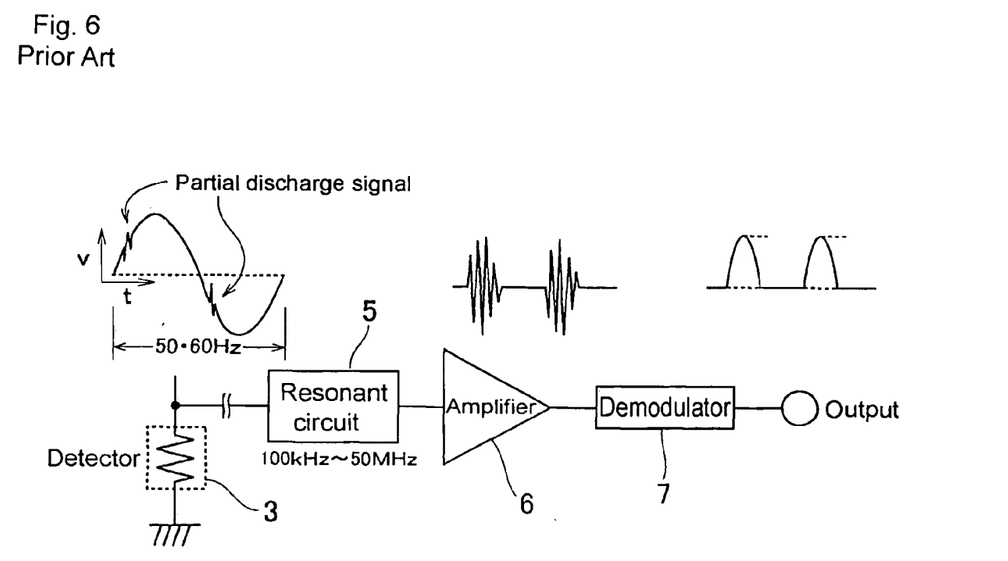
FIG. 6 is a block diagram showing an example of a partial discharge detection apparatus used for the partial discharge detection method shown in FIG. 5.

As shown in FIG. 5, the shield room is a room that is grounded, in which a high voltage is applied to a power cable 1 via a blocking coil 2. In addition, a detector 3 is attached to the power cable 1 to measure an electric current flowing through a circuit including a high-voltage capacitor 4, and to thereby detect the partial discharge. Here, to detect the partial discharge, an output signal from the detector 3 is transmitted through a resonant circuit 5 to remove commercial frequency components from the output signal, as shown in FIG. 6, thereby acquiring only a partial discharge signal associated with the partial discharge. The partial discharge signal is amplified by an amplifier 6 and then demodulated by a demodulator 7. Thus, a signal is obtained which has an amplitude corresponding to the amount of the partial discharge.

Figure 7:
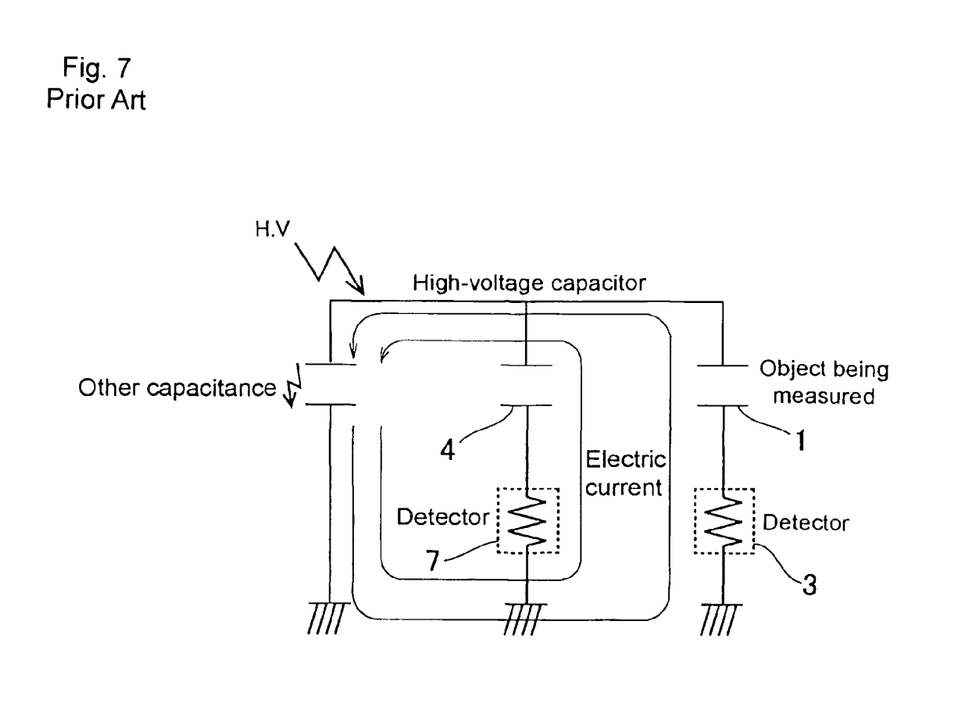
FIG. 7 is a diagram of a circuit for removing a noise captured by a power cable, according to the partial discharge detection method shown in FIG. 5.
Figure 8:
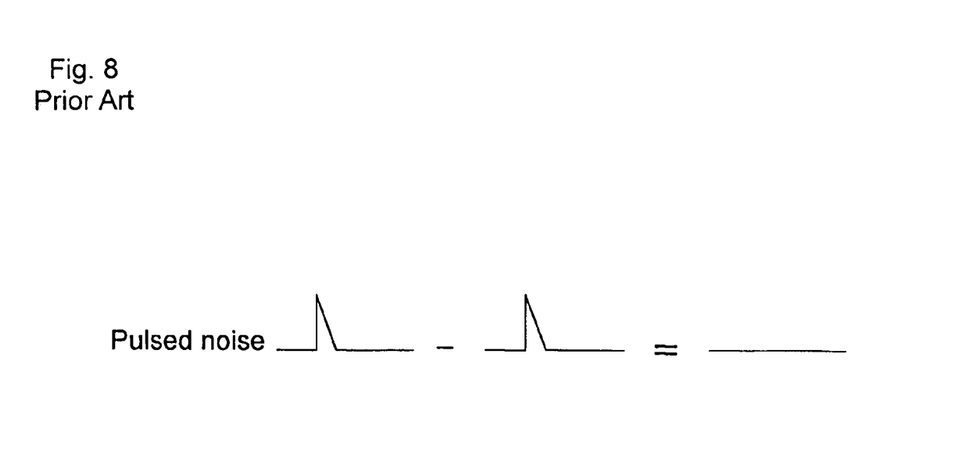
FIG. 8 is a waveform diagram showing a method for removing noise detected by two detectors in the circuit shown in FIG. 7.

As described above, external noise caused by, for example, electromagnetic waves or engine sparks from a vehicle are removed by measuring the partial discharge inside the shield room. However, it is not possible to prevent noise caused by a motor attached to a step-up transformer inside the shield room or noise caused by aerial discharges from an terminal of the power cable. To remove such noise, for example, a detector 7 may be attached to the high-voltage capacitor 4 to differentiate the outputs from the two detectors 3 and 7, as shown in FIG. 7. In this case, the noise captured by the power cable causes electric currents to flow through the two detectors 3 and 7 in the same direction. Accordingly, the noise is cancelled out by differentiating the outputs from the two detectors 3 and 7, as shown in FIG. 8.

Figure 9:
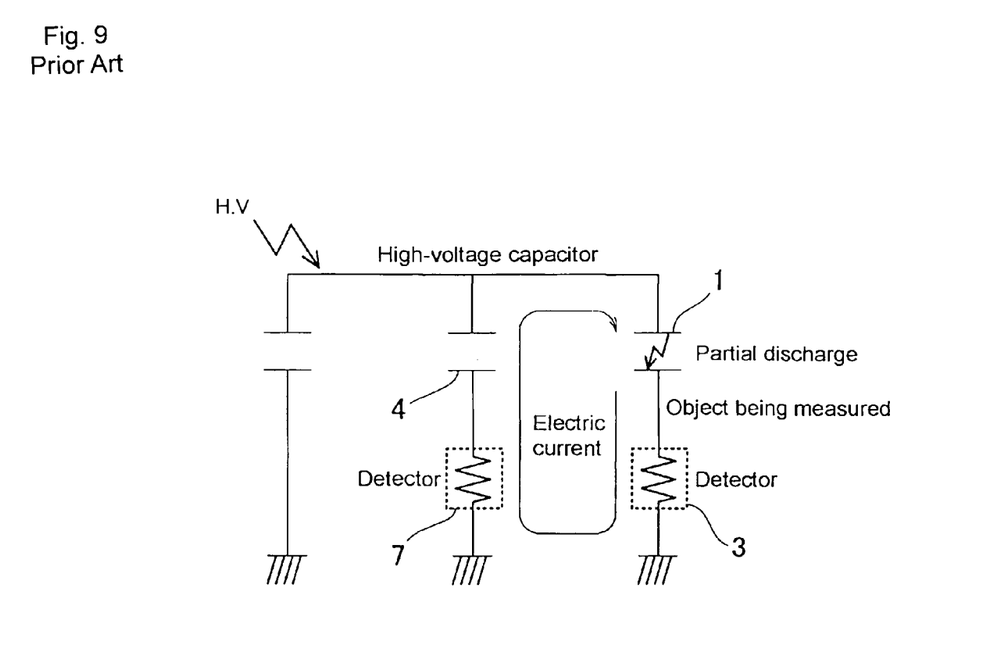
FIG. 9 is a schematic view showing the flow of a signal, associated with a partial discharge in the insulator of a power cable, in the circuit shown in FIG. 7.
Figure 10:
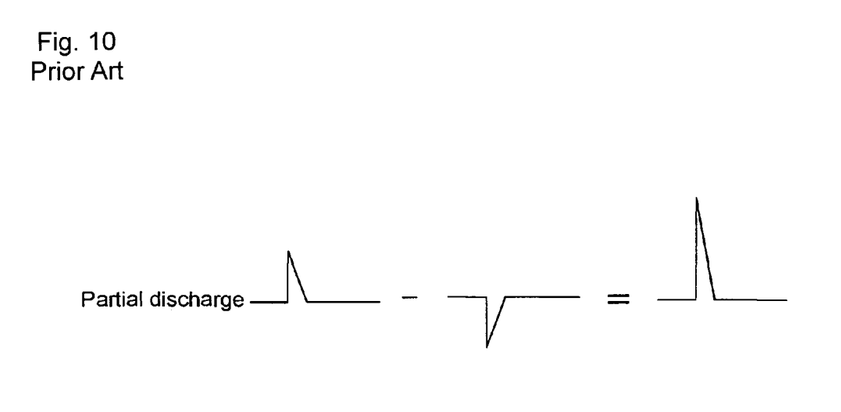
FIG. 10 is a waveform diagram showing the method for detecting a partial discharge signal shown in FIG. 9.

On the other hand, when a partial discharge occurs, electric currents will flow through the two detectors 3 and 7 in opposite directions, as shown in FIG. 9. Accordingly, a high output corresponding to the partial discharge can be obtained by differentiating the outputs from the two detectors 3 and 7, as shown in FIG. 10.

Figure 11:
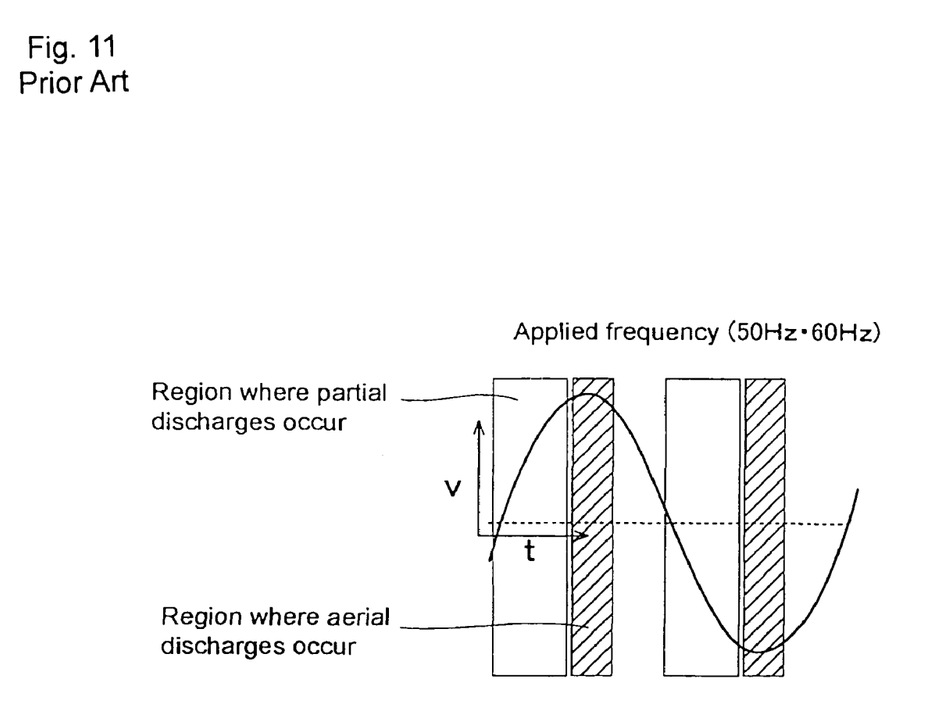
FIG. 11 is a waveform diagram showing another example of a method for detecting only a partial discharge by removing noise therefrom.

In addition, as shown in FIG. 11, a technique for monitoring a phase angle region in which a partial discharge is likely to occur has been disclosed. This technique uses a property that a partial discharge and an aerial discharge are likely to occur in different phase angle regions of a signal at an applied frequency (commercial frequency) (e.g., see Japanese Patent Laid-Open Publication No. Hei 6-331686).

Figure 12:
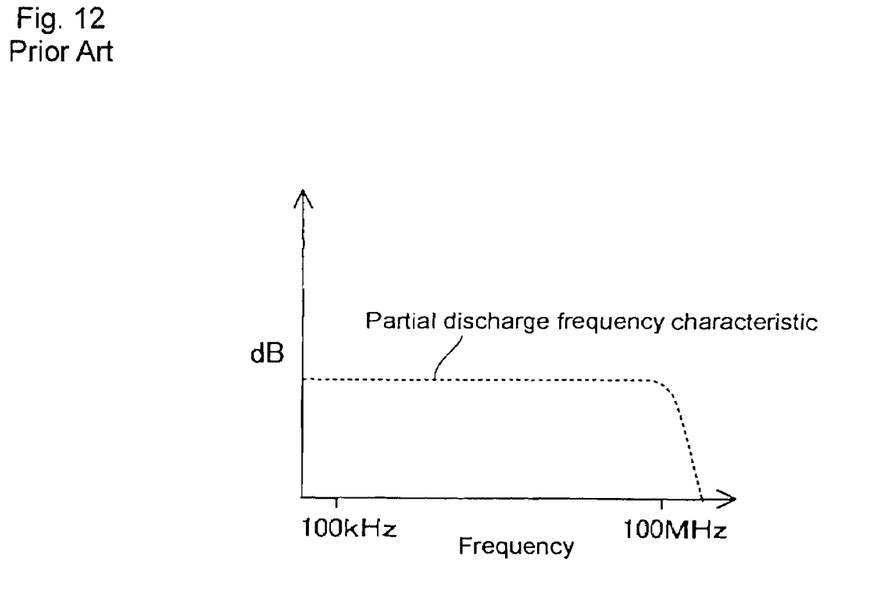
FIG. 12 is a graph showing the frequency characteristic of a partial discharge signal.
Figure 13:
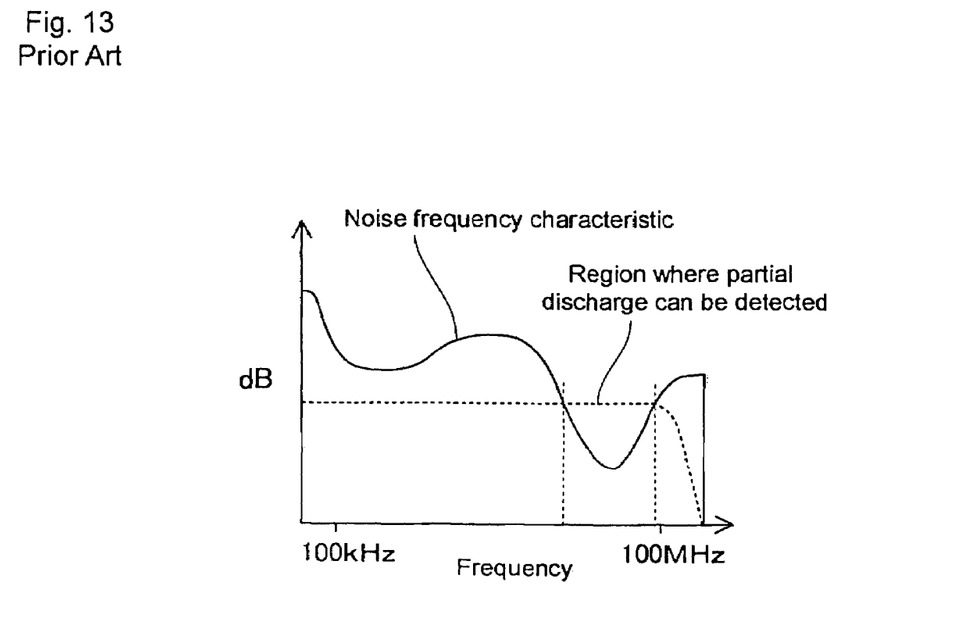
FIG. 13 is a graph showing a method for detecting only a partial discharge by using difference of frequency characteristics between a partial discharge signal and noise.

When monitoring a partial discharge in an in-service power cable, since the power cable may capture noise caused by, for example, electromagnetic waves, such noise must be removed. Another technique for detecting a signal associated with a partial discharge by monitoring a partial discharge in a frequency region at a low noise level has been disclosed, as shown in FIG. 13 (e.g., see Japanese Patent Laid-Open Publication No. Hei 6-308192). This technique utilizes the fact that a signal associated with a partial discharge has a flat frequency characteristic, as shown in FIG. 12.

Figure 14:
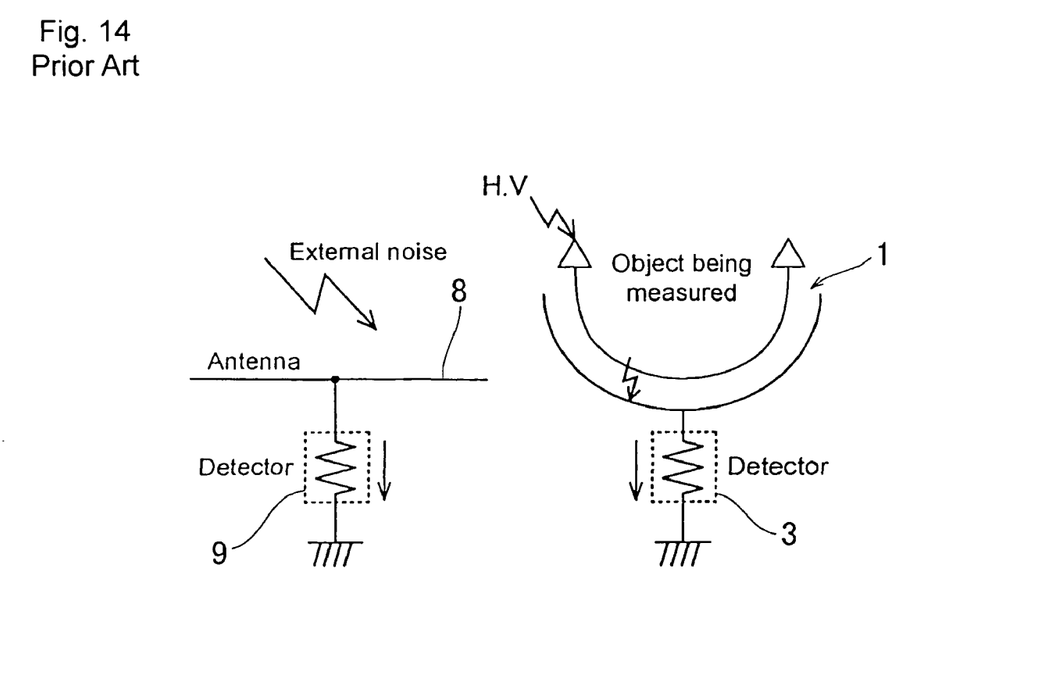
FIG. 14 is a schematic view showing another method for detecting only a partial discharge signal by removing noise therefrom.
Figure 15:
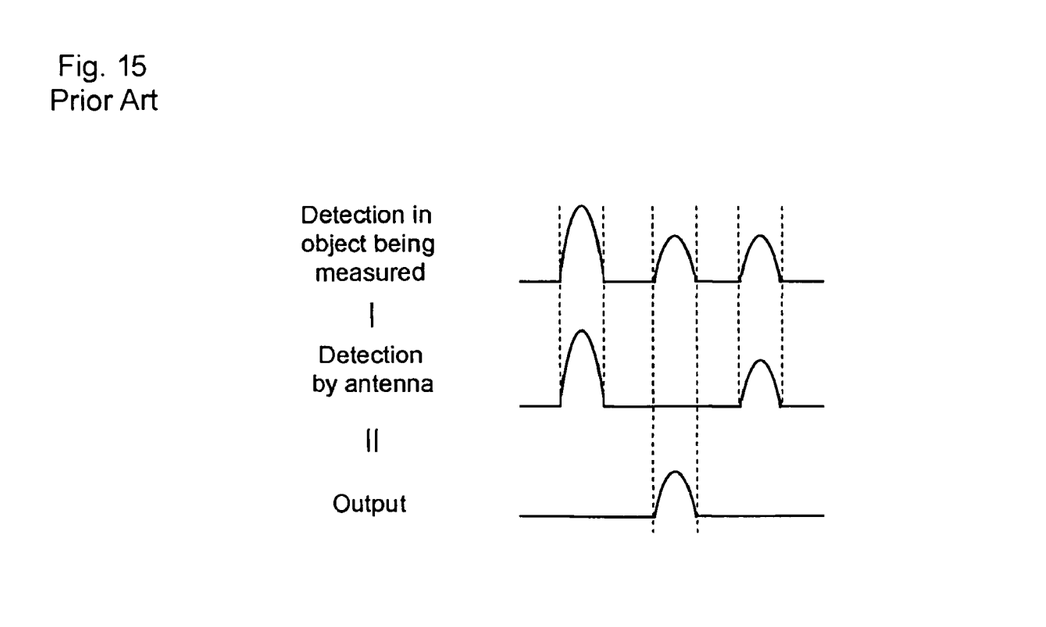
FIG. 15 is a waveform diagram showing a method for detecting only a partial discharge signal according to the method shown in FIG. 14.

Furthermore, a method for detecting noise, such as noise caused by engine sparks from a vehicle, using a detector 9 attached to an antenna 8 which is installed near the power cable is available, as shown in FIG. 14. This method utilizes the fact that noise is received by both the power cable and the antenna whereas a signal associated with a partial discharge is propagated only through the power cable. Thus, the noise can be cancelled out and a signal associated only with the partial discharge can be detected by differentiating the outputs from the detector 3 attached to the power cable and the detector 9 attached to the antenna 8, as shown in FIG. 15.

However, in the case of monitoring a partial discharge in the shield room, only a power cable that is not in service can be checked, and a power cable that is in service cannot be checked for a partial discharge. Thus, it is not possible to detect degradation of an in-service insulator.

Additionally, in the case of monitoring a partial discharge within the frequency region at the low noise level, it is difficult to select a detecting frequency because noise frequency characteristics may vary depending on the location of measurement. Furthermore, even when measurements are made at the same location, the noise frequency characteristics may vary over time. Thus, although a partial discharge can be detected during a particular period of time, it may be difficult to detect a partial discharge at all times. In addition, a frequency region at a low noise level is typically a high-frequency region. Thus, a long cable, such as a power cable, has greatly increased signal attenuation. Therefore, the sensitivity of the detection deteriorates when a partial discharge occurs in a distant place from the detection location. Furthermore, since the detection of the partial discharge is performed within a frequency region at a low noise level, the detecting frequency must be varied corresponding to a change of noise frequency characteristics, thereby increasing the complexity of the circuit configuration.

On the other hand, in the method for canceling out noise by installing the antenna, the detected pulse obtained from an object being measured and the detected pulse obtained through the antenna are often different both in level and timing. Thus, the method cannot easily distinguish noise from a partial discharge. Furthermore, the method has no effect on non-pulsed noise, such as electromagnetic noise. In addition, when the electromagnetic noise level is high or noise occurs very frequently, a signal associated with a partial discharge may be masked by the noise.

SUMMARY OF THE INVENTION

To overcome the problems described above, preferred embodiments of the present invention provide a method for detecting a partial discharge in a high-voltage transmission and distribution system, which enables monitoring of a partial discharge at all times that occurs in an in-service high-voltage transmission and distribution system without being affected by various noises, and also provide a partial discharge detection apparatus used therefor.

A preferred embodiment of the present invention provides a method for detecting a partial discharge in a high-voltage transmission and distribution system, which includes the steps of detecting a signal propagated through the high-voltage transmission and distribution system and an electromagnetic signal near the high-voltage transmission and distribution system, extracting a predetermined frequency component from the signal propagated through the high-voltage transmission and distribution system and the electromagnetic signal to acquire a first signal and a second signal, adjusting a phase and an amplitude of at least one of the first signal and the second signal to match the phase and the amplitude of the first signal and the second signal with each other when no partial discharge is present in the high-voltage transmission and distribution system, and differentiating between the first signal and the second signal.

In such a method for detecting a partial discharge in the high-voltage transmission and distribution system, the amount of adjustment in phase and amplitude of at least one of the first signal and the second signal is determined, for example, by feeding back the difference between the first signal and the second signal.

When a partial discharge is to be detected in an insulator of a power cable used as the high-voltage transmission and distribution system, the first signal and the second signal are acquired by extracting a predetermined frequency component from signals detected in adjacent phase power cables.

Another preferred embodiment of the present invention provides a partial discharge detection apparatus, which includes a first detector for detecting a signal propagated through a high-voltage transmission and distribution system, a second detector for detecting an electromagnetic signal near the high-voltage transmission and distribution system, a first resonant circuit and a second resonant circuit for extracting a predetermined frequency component from an output signal supplied by the first detector and the second detector to acquire a first signal and a second signal, respectively, a regulator connected to at least one of the first resonant circuit and the second resonant circuit for adjusting a phase and an amplitude of at least one of the first signal and the second signal, and a differential circuit for obtaining a difference between the first signal and the second signal after the phase and the amplitude of at least one of the first signal and the second signal are adjusted by the regulator.

Such a partial discharge detection apparatus may also include a computing device for feeding back an output signal from the differential circuit to determine the amount of adjustment in phase and amplitude in the regulator.

The signal components included in both the first signal and the second signal are cancelled out, and the signal component included in only the first signal is output, by differentiating between the first signal extracted from the signal propagated through the high-voltage transmission and distribution system and the second signal extracted from an electromagnetic signal detected by the antenna located near the high-voltage transmission and distribution system. Electromagnetic noise and other noise are cancelled out by adjusting the regulator such that the difference between the first signal and the second signal is minimized when no partial discharge is present. Furthermore, pulsed noise, which is from both the detector that is attached to the high-voltage transmission and distribution system and the detector that is attached to the antenna located near the system, is cancelled out by differentiating the outputs of the detectors. On the other hand, a signal associated with a partial discharge is output only from the detector attached to the high-voltage transmission and distribution system. Thus, the signal associated only with the partial discharge is extracted by differentiating between the first signal and the second signal.

Here, it is possible to keep the condition in which noise signals are cancelled out by feeding back the difference between the first signal and the second signal and by adjusting the phase and the amplitude of the signal using a computing device such that the phase and the amplitude of the first signal and the second signal are matched with each other.

When a partial discharge is detected in an insulator of a power cable used as a high-voltage transmission and distribution system, the first signal and the second signal are acquired using adjacent phase power lines. That is, a phase power line adjacent to the power line in which a partial discharge is to be detected can be used as an antenna. Thus, it is not necessary to provide an additional antenna.

According to preferred embodiments of the present invention, it is possible to detect a partial discharge in an in-service high-voltage transmission and distribution system. Furthermore, by differentiating between the first signal and the second signal and to remove noise, a partial discharge is monitored at all times. This makes it possible to detect a degradation of the insulator of the in-service high-voltage transmission and distribution system, and thus, prevent the occurrence of faults, such as a short circuit, therein.

Other features, elements, steps, characteristics, and advantages of the present invention will become more apparent from the following description of preferred embodiments of the present invention with reference to the attached drawings.

DETAILED DESCRIPTION OF PREFERRED EMBODIMENTS

Figure 1:
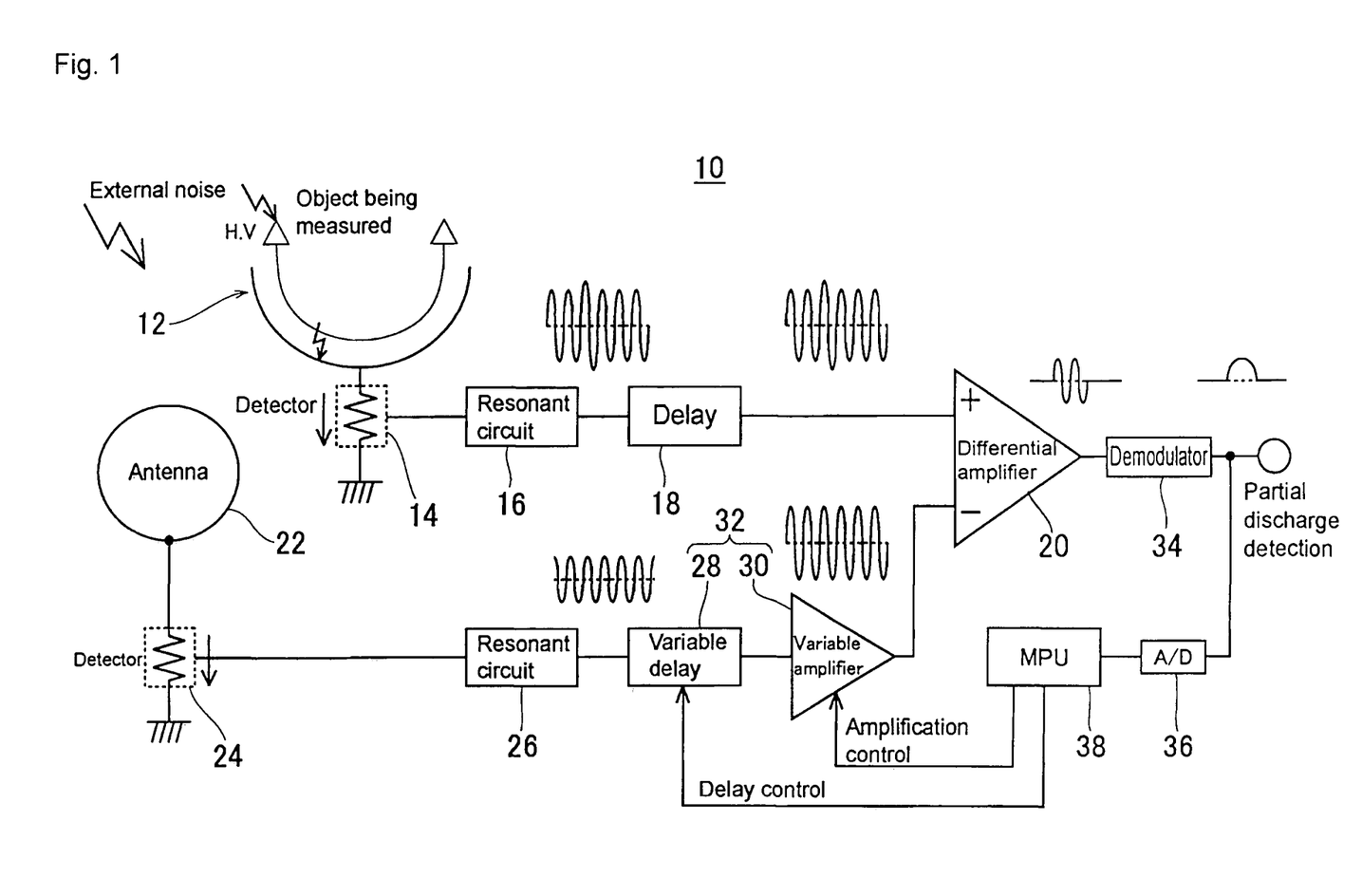
FIG. 1 is a block diagram showing an example of a partial discharge detection apparatus according to a preferred embodiment of the present invention.

FIG. 1 is a schematic view showing an example of a partial discharge detection apparatus according to a preferred embodiment of the present invention. A partial discharge detection apparatus 10 is attached to an object being measured, e.g., a high-voltage power cable, to detect a partial discharge in an insulator of a power cable 12. A first detector 14 is attached to the power cable 12. The first detector 14, which may be, e.g., a current transformer (CT), is coupled to a ground line of a relay connection of the power cable 12. The first detector 14 is connected to a first resonant circuit 16, which is in turn connected to a delay circuit 18. The delay circuit 18 is connected to one input terminal of a differential amplifier 20 serving as a differential circuit.

Furthermore, the partial discharge detection apparatus 10 includes an antenna 22 located near the power cable 12. A second detector 24 is attached to the antenna 22. The second detector 24 is connected to a second resonant circuit 26, which is in turn connected to a regulator 32 that includes a variable delay circuit 28 defining a phase shifter and a variable amplifier 30. The regulator 32 is connected to the other input terminal of the differential amplifier 20. Furthermore, the output terminal of the differential amplifier 20 is connected to a demodulator 34.

An output signal from the demodulator 34 is used to detect a partial discharge, and the output signal is digitized by an A/D converter 36. The output signal from the A/D converter 36 is sent to an MPU 38 defining a computing device, and the MPU 38 then sends a signal to the regulator 32 for delay control and amplification control. The output signal from the second resonant circuit 26 is adjusted in phase in the variable delay circuit 28, and is adjusted in amplitude in the variable amplifier 30 according to the control signal from the MPU 38.

In the partial discharge detection apparatus 10, the first detector 14 outputs a signal corresponding to an electric signal propagated through the power cable 12. The signal may include a signal at an applied frequency (commercial frequency), noise, or a signal associated with a partial discharge. The output signal from the first detector 14 is sent to the first resonant circuit 16, which in turn outputs a first signal at a predetermined frequency. The applied frequency signal is removed in the first resonant circuit 16 by resonating, for example, at about 200 KHz. The first signal in which the applied frequency signal was removed is sent to the differential amplifier 20 via the delay circuit 18.

An electromagnetic signal received by the antenna 22 is resonated in the second resonant circuit 26 at the same frequency as that of the first resonant circuit 16 to output a second signal. The second signal output from the second resonant circuit 26 is sent to the regulator 32, where the phase is adjusted in the variable delay circuit 28 and the amplitude is adjusted in the variable amplifier 30. Then, the differential amplifier 20 performs a differentiation between the output signal from the delay circuit 18 and the output signal from the regulator 32, and the resulting difference is demodulated in the demodulator 34.

The output signal from the demodulator 34 is converted into a digital signal by the A/D converter 36, and the resulting signal is sent to the MPU 38. The MPU 38 sends a delay control signal and an amplification control signal to the regulator 32, such that the output signal from the demodulator 34 is minimized when no partial discharge is present in the power cable 12. These control signals provide control such that the output signal from the delay circuit 18 and the output signal from the regulator 32 substantially match with each other in phase and amplitude. That is, feeding back the output signal from the demodulator 34 will enable the MPU 38 to determine the amount of adjustment in phase and adjustment in amplitude of the second signal at the regulator 32 and provide control, such that the output signal from the delay circuit 18 and the output signal from the regulator 32 substantially match with each other in phase and amplitude. Accordingly, the output signal from the differential amplifier 20 has a value close to zero when no partial discharge is present in the insulator of the power cable 12.

As described above, noise, such as electromagnetic noise, is removed from the signal detected by the first detector 14 by feeding back the output signal from the demodulator 34 and controlling the output signal of differential amplifier 20 to a value close to zero. Furthermore, pulsed noises, such as engine sparks from a vehicle or sparks from a motor, will also be received by both the power cable 12 and the antenna 22, and thus, will be cancelled out in the differential amplifier 20, so as to yield no output.

Suppose that a partial discharge occurs in the insulator of the power cable 12 when no noise is output from the differential amplifier 20 as described above. In this case, the partial discharge signal will be propagated through the power cable 12, but the partial discharge signal will not be received at the antenna 22. Thus, a signal corresponding to the partial discharge is output from the differential amplifier 20, and a signal having a level corresponding to the amount of the partial discharge is obtained by demodulating the output signal. Accordingly, electromagnetic noises or pulsed noises are removed, and only a signal corresponding to the partial discharge is output from the partial discharge detection apparatus 10.

Furthermore, in the partial discharge detection apparatus 10, only a signal at a predetermined frequency is permitted to be output by the first resonant circuit 16 and the second resonant circuit 26. However, a lower resonant frequency may be set. Thus, it is possible to select a frequency at which the signal is attenuated to a lesser extent. Thus, even when a partial discharge occurs at a distant location from where the first detector 14 is located, the partial discharge signal can be detected without being substantially attenuated. This makes it possible to detect a partial discharge with outstanding sensitivity.

Furthermore, the resonant frequency of the first resonant circuit 16 and the second resonant circuit 26 are not necessarily variable, and instead may be fixed to one frequency in the partial discharge detection apparatus 10, thus simplifying the circuit configuration. In addition, the output signal from the demodulator 34 is fed back and noise discrimination is performed under the control of the MPU 38, thus allowing the noise discrimination to be automatically performed without adjustment.

Figure 2:
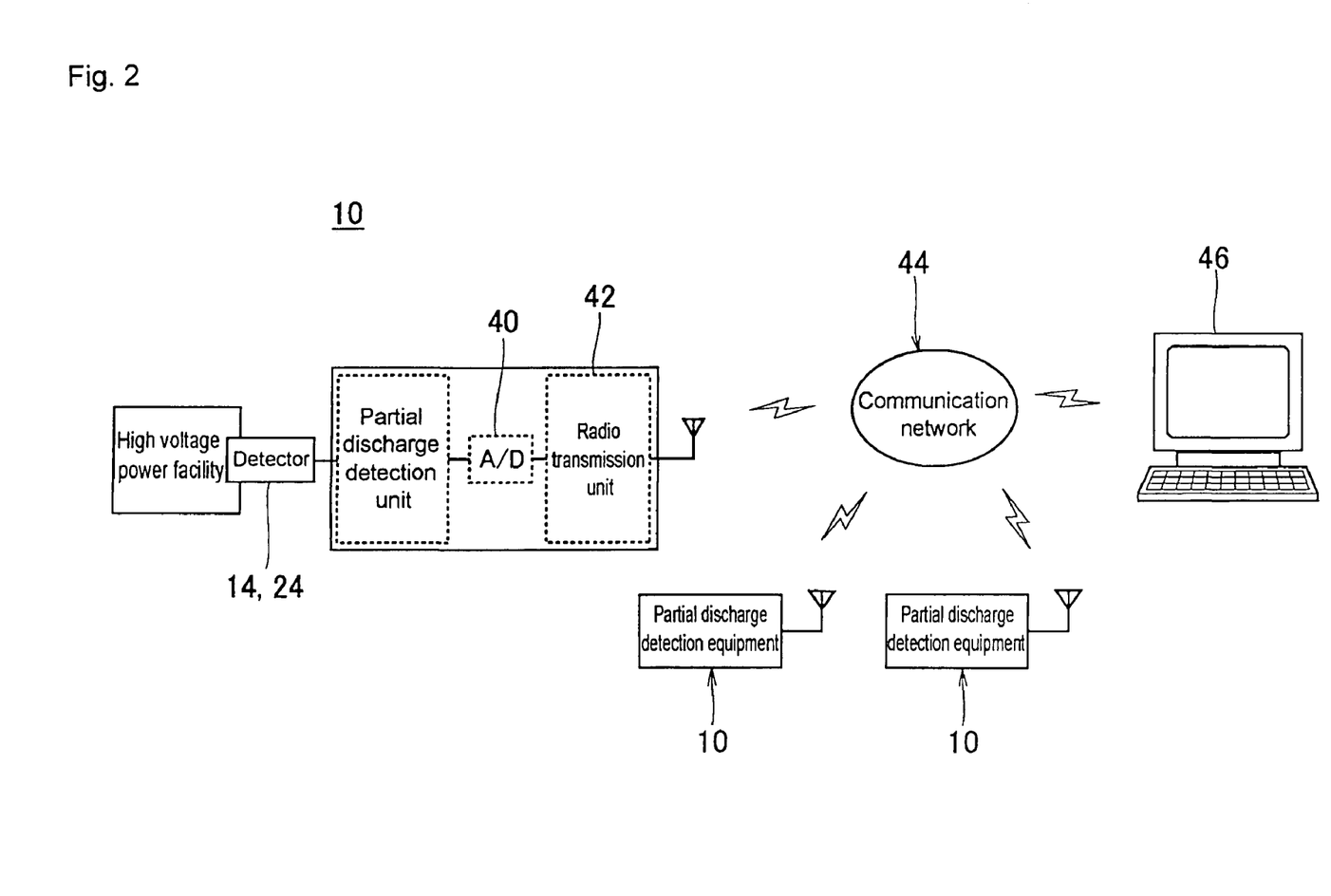
FIG. 2 is a schematic view showing an example of monitoring a wide range of high-voltage transmission and distribution systems using the partial discharge detection apparatus.

The resulting signal corresponding to a partial discharge may be sent to a computer, for example, which may be installed at a monitoring center. In this case, the partial discharge detection apparatus 10 includes, for example, an A/D converter 40 for converting the signal corresponding to the partial discharge detected into a digital signal and a radio transmission unit 42, as shown in FIG. 2. The signal corresponding to the partial discharge detected is converted into a digital signal by the A/D converter 40, and the resulting signal is sent from the radio transmission unit 42 to a computer 46 at the monitoring center via a communication network 44. The computer 46 may be configured so as to receive signals from partial discharge detection apparatuses 10 installed at a plurality of locations of the power cable 12, thereby enabling centralized monitoring of partial discharges that occur in a wide area of the high-voltage power system.

Referring to FIG. 1, the regulator 32 is connected with the second resonant circuit 26 for the antenna 22 side to adjust the phase and amplitude of the second signal. However, such a regulator may be connected with the first resonant circuit 16 for the power cable 12 side. In this case, the output from the demodulator 34 is fed back, and the phase and amplitude of the first signal output from the first resonant circuit 16 is adjusted by the MPU 38, such that the output from the differential amplifier 20 is controlled to be approximately zero. Furthermore, a regulator may be connected with both the first resonant circuit 16 and the second resonant circuit 26 to adjust the phase and the amplitude of the first signal and the second signal, such that the output from the differential amplifier 20 is controlled to be approximately zero.

The partial discharge detection apparatus 10, which can be used to detect a partial discharge in an underground power cable, is effectively available when an adjacent phase power line of a three-phase power line is used as the antenna 22. In this case, for example, detectors 48a, 48b, and 48c are each connected to a ground line of the terminal of a power line, and the detectors 48a, 48b, and 48c are connected to resonant circuits 50a, 50b, and 50c, respectively, as shown in FIG. 3.

These resonant circuits 50a, 50b, and 50c are connected to three differential amplifiers 52a, 52b, and 52c, respectively. The resonant circuits 50a, 50b, and 50c are connected to one input terminal of the differential amplifiers 52a, 52b, and 52c, as well as to regulators 54a, 54b, and 54c, respectively. Each of the regulators 54a, 54b, and 54c include a variable delay circuit and a variable amplifier similar to the regulator 32 shown in FIG. 1. The output terminals of the regulators 54a, 54b, and 54c are connected to the other input terminals of the differential amplifiers 52a, 52b, and 52c, respectively.

Figure 3:
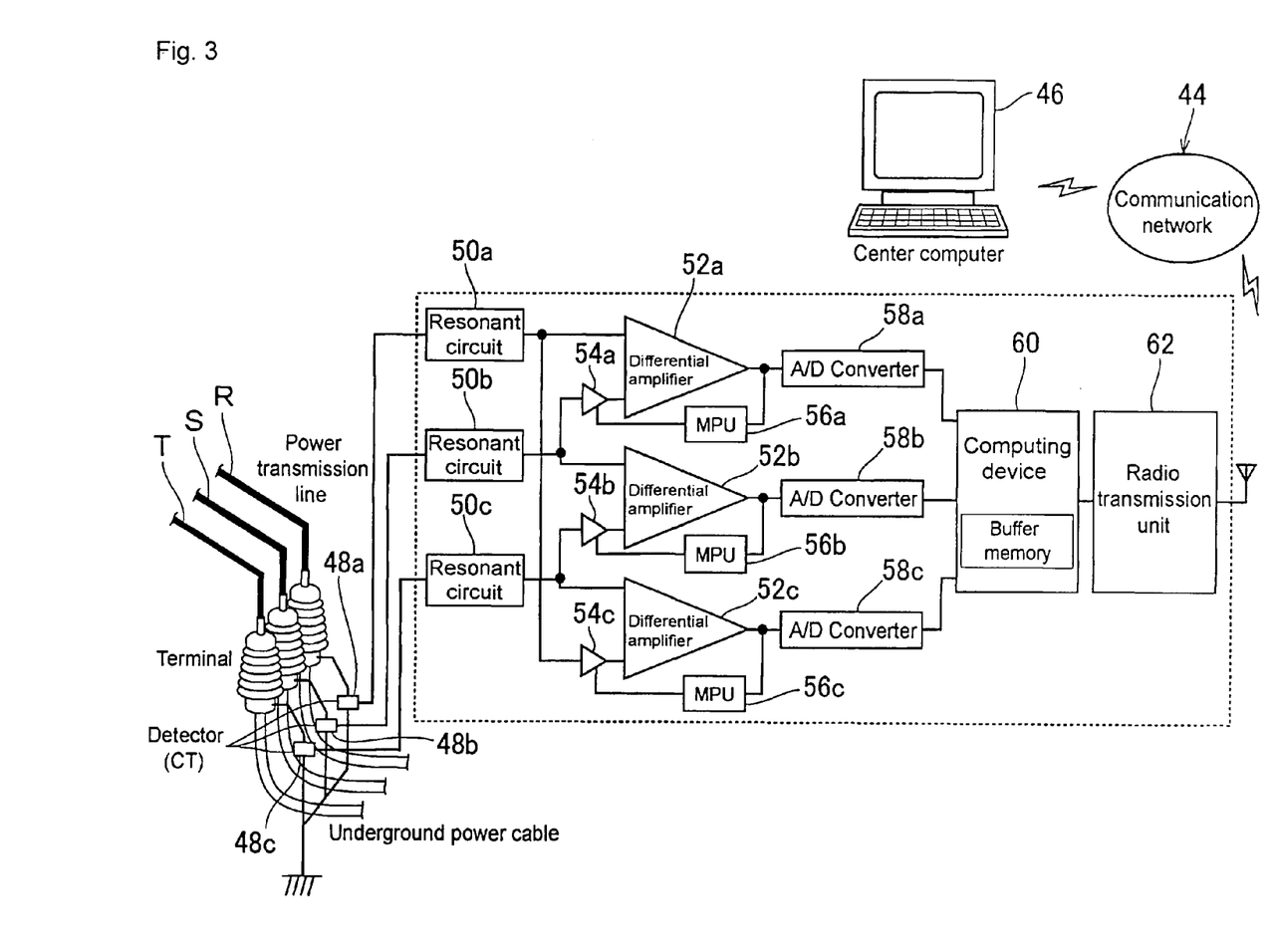
FIG. 3 is a block diagram showing an example of the partial discharge detection apparatus for sensing a partial discharge in the insulator of a three-phase power cable.

Referring to FIG. 3, the output terminal of the resonant circuit 50a connected to the R-phase detector 48a is connected to one input terminal of the differential amplifier 52a and the input terminal of the regulator 54c. The output terminal of the regulator 54c is connected to the other input terminal of the differential amplifier 52c. The output terminal of the resonant circuit 50b connected to the S-phase detector 48b is connected to one input terminal of the differential amplifier 52b and the input terminal of the regulator 54a. The output terminal of the regulator 54a is connected to the other input terminal of the differential amplifier 52a. The output terminal of the resonant circuit 50c connected to the T-phase detector 48c is connected to one input terminal of the differential amplifier 52c and the input terminal of the regulator 54b. The output terminal of the regulator 54b is connected to the other input terminal of the differential amplifier 52b.

Furthermore, the output signals from the differential amplifiers 52a, 52b, and 52c are respectively converted into digital signals, which are in turn sent to MPUs 56a, 56b, and 56c, respectively. The signal supplied by the resonant circuits 50a, 50b, and 50c are adjusted in phase and amplitude in the regulators 54a, 54b, and 54c according to the control signals from the MPUs 56a, 56b, and 56c, respectively. Furthermore, the output signals from the differential amplifiers 52a, 52b, and 52c are converted to digital signals in A/D converters 58a, 58b, and 58c, respectively, and then processed in a computing device 60 for measuring the amount of the partial discharge. The measured amount of the partial discharge is recorded in a buffer memory or other suitable memory device, and then sent from a radio transmission unit 62 to the computer 46 via the communication network 44.

As such, an adjacent phase power line of a power cable may be used as an antenna. For example, the S-phase power line may be used as an antenna to detect a partial discharge in the R-phase power line. This eliminates the need to install an antenna, in addition to the power cable. As in the R-phase, a partial discharge in the other S-phase or T-phase power line may also be detected using an adjacent phase power line as an antenna. This also eliminates the need to install an antenna in addition to the power cable.

Figure 4:
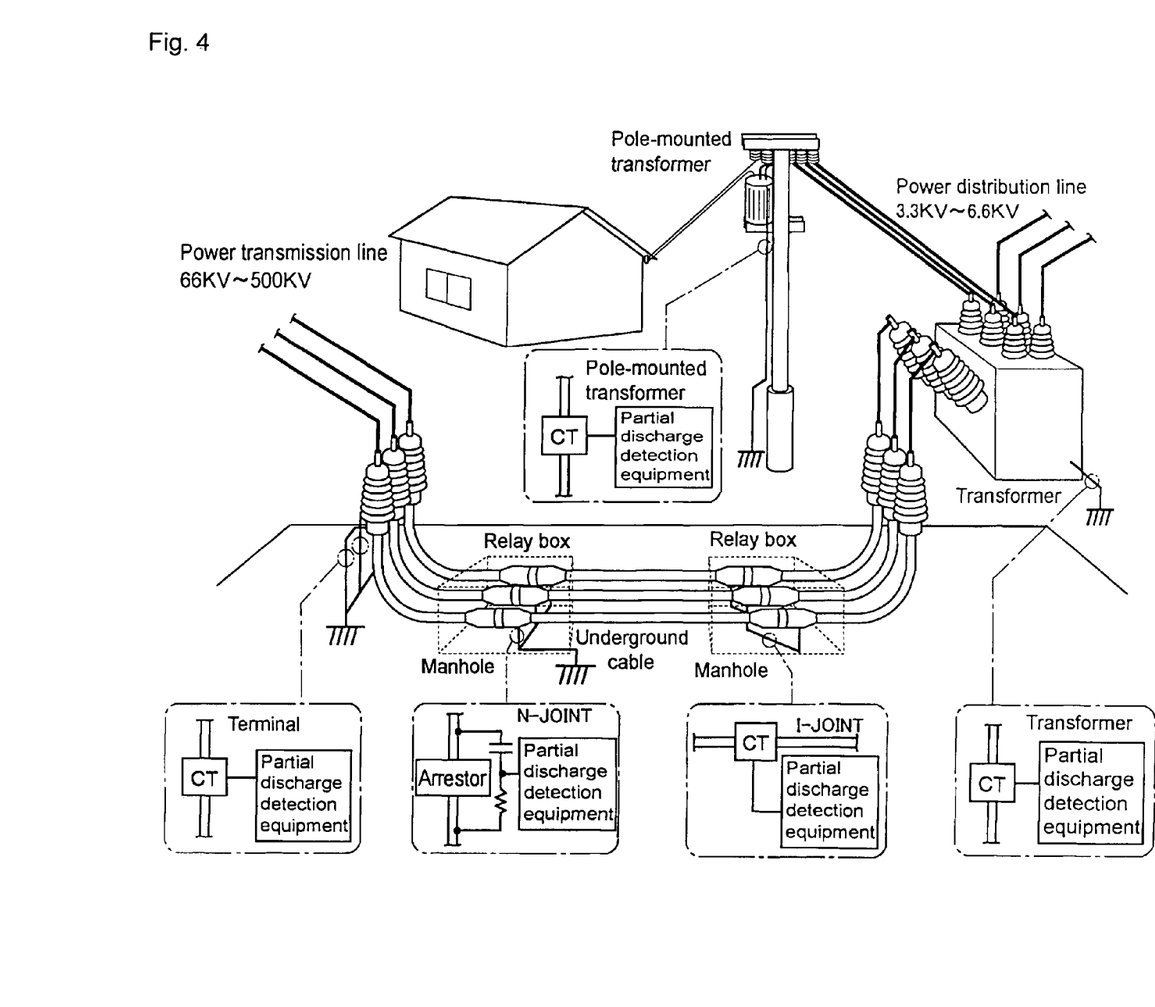
FIG. 4 is a schematic view showing a configuration of the partial discharge detection apparatuses attached to various high-voltage transmission and distribution systems.

As shown in FIG. 4, the detector may be attached to a ground line of the terminal or a relay connection of a power cable, thereby enabling detection of a partial discharge in the insulator of the power cable. The detector may also be attached to the ground line of a transformer in the high voltage transmission and distribution system or a pole-mounted transformer, thereby enabling detection of a partial discharge in the transformer in the high voltage transmission and distribution system or the pole-mounted transformer. As such, the partial discharge detection apparatus 10 may be used to monitor a partial discharge at all times in an in-service high-voltage transmission and distribution system and predict an electrical breakdown in the high-voltage transmission and distribution system, thereby making it possible to take appropriate maintenance.

While preferred embodiments of the present invention have been described above, it is to be understood that variations and modifications will be apparent to those skilled in the art without departing the scope and spirit of the invention. The scope of the invention, therefore, is to be determined solely by the following claims.

What is claimed is:

1. A method for detecting a partial discharge in a high-voltage transmission and distribution system, comprising the steps of:

detecting a signal propagated through the high-voltage transmission and distribution system and an electromagnetic signal near the high-voltage transmission and distribution system;

extracting a predetermined frequency component from the signal propagated through the high-voltage transmission and distribution system and the electromagnetic signal to acquire a first signal and a second signal;

adjusting a phase and an amplitude of at least one of the first signal and the second signal such that the phase and the amplitude of the first signal and the second signal are matched with each other when no partial discharge is present in the high-voltage transmission and distribution system; and differentiating between the first signal and the second signal.

2. The method for detecting a partial discharge in a high-voltage transmission and distribution system according to claim 1, further comprising the step of:

feeding back the difference between the first signal and the second signal to determine the amount of adjustment in phase and amplitude of at least one of the first signal and the second signal.

3. The method for detecting a partial discharge in a high-voltage transmission and distribution system according to claim 1, wherein:

the high-voltage transmission and distribution system is defined by a power cable including an insulator;

the partial discharge is detected in the insulator of the power cable; and the first signal and the second signal are acquired by extracting predetermined frequency components from signals detected in adjacent phase power lines of the power cable.

4. A partial discharge detection apparatus comprising:

a first detector arranged to detect a signal propagated through a high-voltage transmission and distribution system;

a second detector arranged to detect an electromagnetic signal near the high-voltage transmission and distribution system;

a first resonant circuit and a second resonant circuit arranged to extract a predetermined frequency component from an output signal supplied by the first detector and the second detector to acquire a first signal and a second signal, respectively;

a regulator connected to at least one the first resonant circuit and the second resonant circuit and arranged to adjust a phase and an amplitude of at least one of the first signal and the second signal; and a differential circuit arranged to differentiate between the first signal and the second signal after the phase and the amplitude of at least one of the first signal and the second signal are adjusted by the regulator.

5. The partial discharge detection apparatus according to claim 4, further comprising a computing device arranged to feed back an output signal from the differential circuit to determine the amount of adjustment in phase and amplitude which is to be supplied to the regulator.

* * * * *